United States Patent [19]

Yoshida

[11] Patent Number: 5,191,397
[45] Date of Patent: Mar. 2, 1993

[54] SOI SEMICONDUCTOR DEVICE WITH A WIRING ELECTRODE CONTACTS A BURIED CONDUCTOR AND AN IMPURITY REGION

[75] Inventor: Tohru Yoshida, Warabi, Japan

[73] Assignee: Kabushiki Kaisha Toshiba, Kanagawa, Japan

[21] Appl. No.: 684,932

[22] PCT Filed: Sep. 4, 1990

[86] PCT No.: PCT/JP90/01124

§ 371 Date: Apr. 24, 1991

§ 102(e) Date: Apr. 24, 1991

[30] Foreign Application Priority Data

Sep. 7, 1989 [JP] Japan .................. 1-230534

[51] Int. Cl.$^5$ .............................. H01L 29/78
[52] U.S. Cl. ................... 257/347; 257/382; 257/776; 257/784
[58] Field of Search ............ 357/23.7, 65, 71

[56] References Cited

U.S. PATENT DOCUMENTS

| | | | |
|---|---|---|---|
| 4,829,018 | 5/1989 | Wahlstrom | 357/23.7 |
| 4,902,637 | 2/1990 | Kondou et al. | 357/23.7 |
| 4,907,047 | 3/1990 | Kato et al. | 357/23.7 |

FOREIGN PATENT DOCUMENTS

| | | | |
|---|---|---|---|
| 62-274778 | 11/1987 | Japan | 357/23.7 |
| 63-265464 | 11/1988 | Japan | 357/23.7 |
| 2-2176 | 1/1990 | Japan | 357/23.7 |

OTHER PUBLICATIONS

Makoto Yoshima, et al., "Characteristic Analysis of High-Performance SOI MOSFET Using Thin Film SOI," Transactions of the Institute of Electronics and Communication Engineers of Japan, SDM 87-154, (Jan. 1988) pp. 13-18.

Primary Examiner—Rolf Hille
Assistant Examiner—Steven Loke
Attorney, Agent, or Firm—Finnegan, Henderson, Farabow, Garrett and Dunner

[57] ABSTRACT

According to this invention, an SOI semiconductor device having a thin semiconductor film (15) formed on an insulating film (12) includes a semiconductor substrate (11), the insulating film (12) having a recess portion (13a, 13b) and formed on the semiconductor substrate (11), and a conductor (14a, 14b) buried in the recess portion (13a, 13b). In addition, the SOI semiconductor device further includes the semiconductor film (15) formed on the insulating film (12), and an impurity region (16) formed in the semiconductor film (15) and electrically connected to the conductor (14a, 14b).

6 Claims, 5 Drawing Sheets

SOI SEMICONDUCTOR DEVICE WITH A WIRING ELECTRODE CONTACTS A BURIED CONDUCTOR AND AN IMPURITY REGION

TECHNICAL FIELD

The present invention relates to an SOI (Silicon On Insulator) semiconductor device and a method of manufacturing the same used especially in a very high-speed, very large-scaled MOS integrated circuit.

BACKGROUND ART

Conventionally, an SOI MOS transistor has a sectional structure shown in FIG. 1 or 2. Referring to FIGS. 1 and 2, reference numeral 1 denotes a silicon substrate; 2, an $SiO_2$ film; 3, a monocrystalline silicon film; 4, an $n^+$-type region; 5, a gate insulating film; 6, a polysilicon gate; and 7, a depletion layer.

FIG. 1 shows a MOS transistor wherein the monocrystalline silicon film 3 is relatively thick, i.e., a non-depletion region is left under a channel region. In this case, since a gate electric field is applied to both the gate oxide film 5 and the depletion layer 7, the field intensity of a channel region is increased. For this reason, in the MOS transistor, the field effect mobility of electrons is decreased since the crystallinity of the monocrystalline silicon film 3 is inferior to that of the silicon substrate (bulk silicon) 1, and current drivability is disadvantageously degraded.

FIG. 2 shows a MOS transistor wherein the thickness of the monocrystalline silicon film 3 is relatively small, about 500 Å, i.e., an entire portion under the channel region is depleted. In this case, a depletion layer formed in the monocrystalline silicon film 3 reaches the underlying $SiO_2$ film 2. For this reason, a capacitance between the monocrystalline silicon film (p-type, in general) 3 and the $n^+$-type region 4 is decreased, and the field effect mobility of electrons is advantageously increased to be 900 to 1000 $cm^2/V \cdot S$ which is larger than 1.5 times that of a bulk MOS transistor.

In a MOS transistor having the relatively thin monocrystalline silicon film 3, when the monocrystalline silicon film 3 is further thinned, the field effect mobility of electrons can be closed to the mobility (1,350 $cm^2/V \cdot S$) of electrons flowing through the silicon substrate. This is described in "Characteristic Analysis of High-Performance SOI-MOSFET Using Thin Film SOI" by Makoto Yoshimi, et al., transactions (silicon material.device) of the Institute of Electronics and Communication Engineers of Japan, SDM 87-154, pp. 13-18, Jan., 1988.

As shown in FIG. 3, when a contact hole reaching the $n^+$-type region 4 serving as a drain or source is formed in an insulating interlayer 8 by anisotropic etching such as RIE (Reactive Ion Etching), as the monocrystalline silicon film 3 is thinned, a probability of etching the $SiO_2$ film 2 to form a contact hole extending through the $n^+$-type region 4 is increased. In this case, compared with a case wherein a contact hole does not extend through the $n^+$-type region 4, the area of the contact portion between the Al electrode 9 and the $n^+$-type region 4 is decreased by $\pi r^2 - 2\pi rd = \pi r^2(1 - 2d/r)$ where r is the radius of the cylindrical contact hole and d is the thickness of the monocrystalline silicon film 3. In this case, $r > 2d$ must be satisfied. That is, as the thickness d of the monocrystalline silicon film 3 is decreased, the area of the contact portion between the Al electrode 9 and the $n^+$-type region 4 is decreased, thereby disadvantageously increasing its contact resistance. Note that, when wet etching is performed by $NH_4F$ or the like in place Of RIE, the above-mentioned excessive extension of the contact hole can be prevented. However, a margin for contact alignment must be sufficiently obtained. This adversely affects high integration.

When the monocrystalline silicon film 3 is thinned, a diffusion layer formed thereon must also be thinned, thereby increasing the resistance of the diffusion layer wiring. For this reason, even when the monocrystalline silicon film 3 is thinned to increase the field effect mobility of electrons so as to increase the current drivability, a high-speed operation as an integrated circuit cannot be expected. Therefore, the diffusion layer wiring cannot be used. The wiring of the integrated circuit must comprise only an Al wiring film and a gate polysilicon layer, and a degree of freedom of design is limited, thereby disadvantageously increasing the pattern.

It is an object of the present invention to provide a high-speed, high-performance, and high-quality SOI semiconductor device which is manufactured without increasing a contact resistance and a wiring resistance of a diffusion layer even in an SOI-MOS integrated circuit having a thin monocrystalline silicon film.

DISCLOSURE OF INVENTION

According to the present invention, there is provided an SOI semiconductor device comprising a semiconductor substrate, an insulating film having a recess portion and formed on the semiconductor substrate, a conductor buried in the recess portion, a semiconductor film formed on the insulating film, and an impurity region formed on the semiconductor film and electrically connected to the conductor.

According to another aspect of the present invention, there is provided an SOI semiconductor device comprising a semiconductor substrate, an insulating film having a recess portion and formed on the semiconductor substrate, a conductor buried in the recess portion, a semiconductor film formed on the insulating film, an impurity region formed in the semiconductor film above the recess portion and electrically connected to the conductor, an insulating interlayer having a contact hole reaching at least the impurity region in the recess portion and formed on the entire surface of the resultant structure, and an electrode wiring connected to the impurity region through the contact hole.

According to the present invention, there is provided a method of manufacturing an SOI semiconductor device, comprising forming an insulating film on a semiconductor substrate, forming a recess portion in the insulating film, burying a conductor in the recess portion, forming a semiconductor film on the insulating film, and forming an impurity region in the semiconductor film, the impurity region being electrically connected to the conductor.

According to another aspect of the present invention, there is provided a method of manufacturing an SOI semiconductor substrate, comprising forming an insulating film on the semiconductor substrate, forming a recess portion in the insulating film, burying a conductor in the recess portion, forming a semiconductor film on the region on the insulating film, forming an impurity region in the semiconductor film above the recess portion, the impurity region being electrically connected to the conductor, forming an insulating interlayer on an entire surface of the resultant structure, forming a contact hole reaching at least the impurity region in the insulating interlayer above the recess portion, and forming an electrode wiring in a region including a portion above the contact hole.

According the above arrangement, a wiring layer can be formed in the recess portion formed in the insulating film under the semiconductor film. For this reason, even when the semiconductor film is formed to be thin, the resistance of the wiring layer is not increased. In addition, the impurity region is formed in the semiconductor film above the recess portion, and the conductor is buried in the recess portion. For this reason, even when the contact hole is formed to extend through the impurity region, since the conductor is formed in the recess portion, the contact hole does not reach the insulating film thereunder. As a result, the area of the contact portion is not decreased, thereby obtaining a low contact resistance.

BEST MODE OF CARRYING OUT THE INVENTION

An embodiment of the present invention will be described below with reference to the accompanying drawings.

Figure 1:
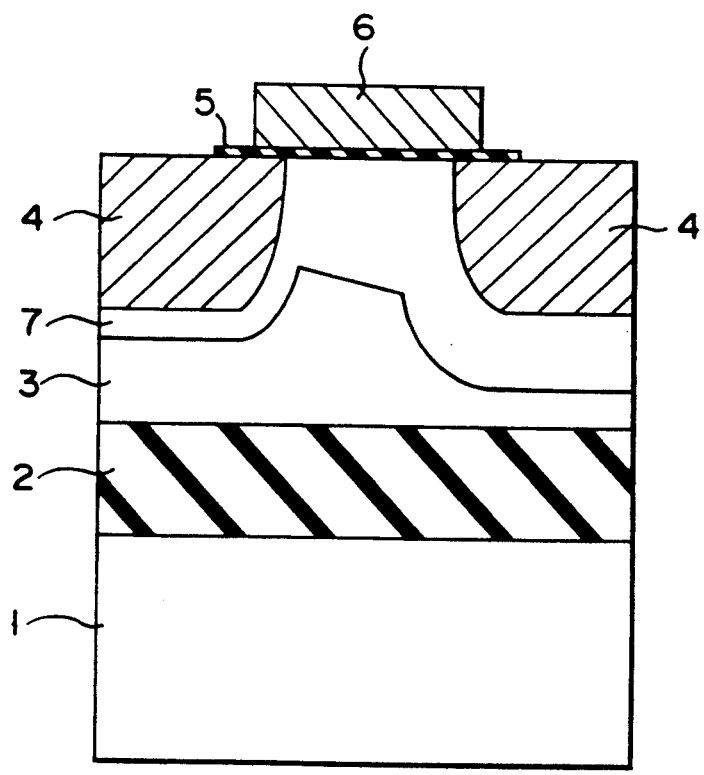
FIGS. 1 to 3 are sectional views showing a conventional SOI·MOS semiconductor device.
Figure 2:
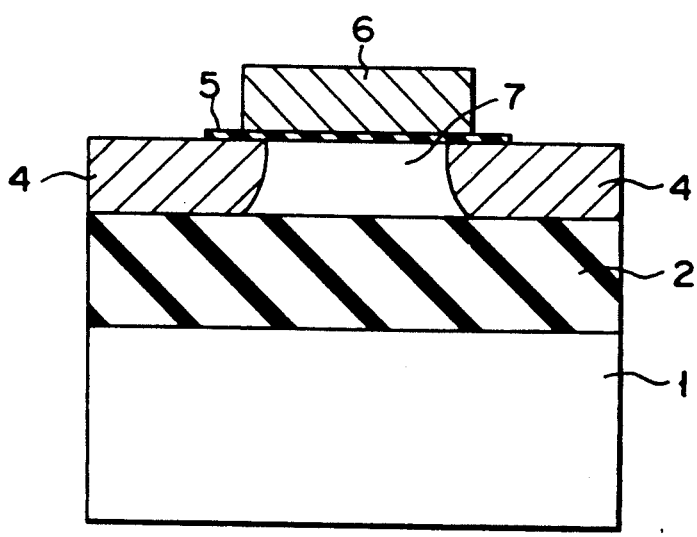
Figure 3:
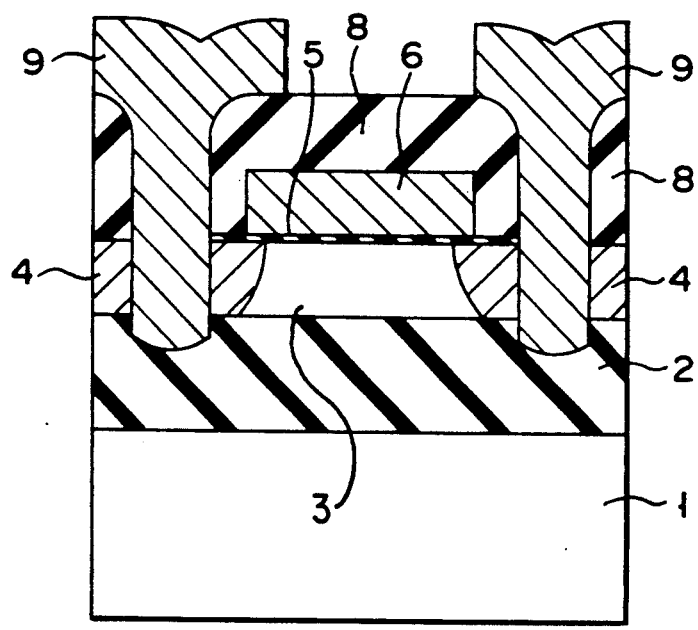
Figure 4:
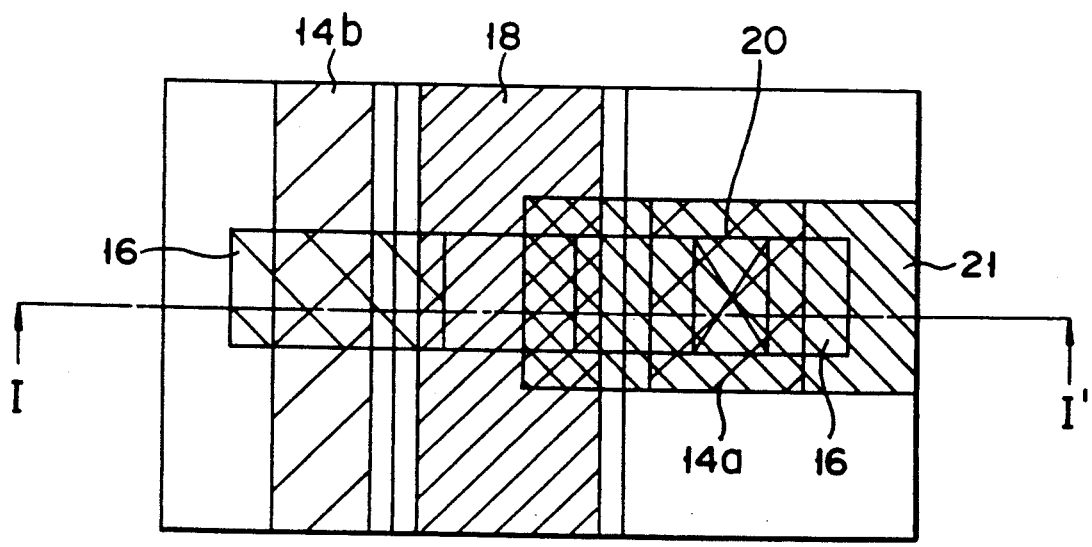
FIG. 4 is a plan view of a pattern showing an SOI·MOS semiconductor device according to an embodiment of the present invention.
Figure 5:
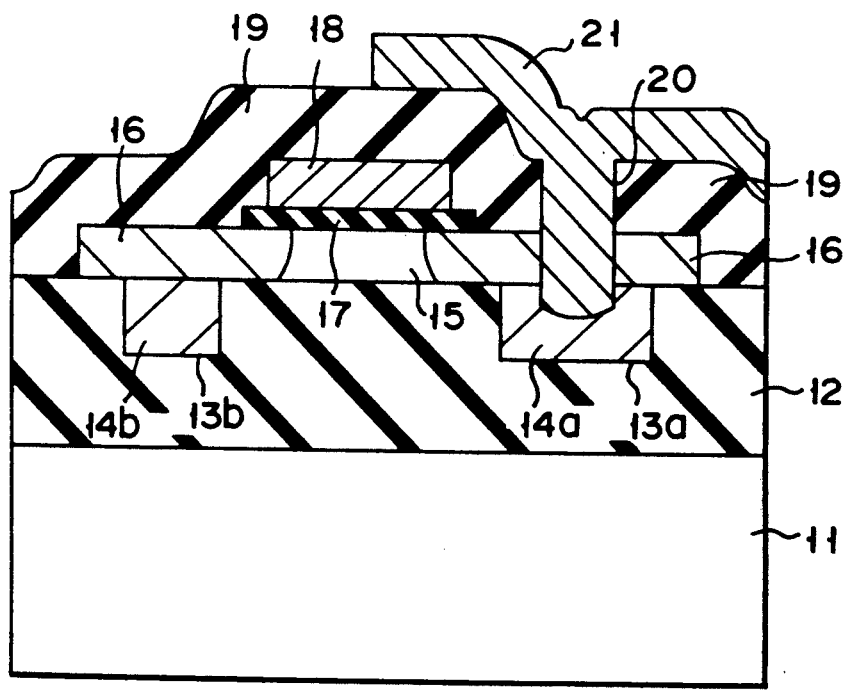
FIG. 5 is a sectional view showing the SOI·MOS semiconductor device along a line I—I' in FIG. 4.

FIG. 4 shows a plan pattern of an SOI·MOS semiconductor device according to an embodiment of the present invention. FIG. 5 is a sectional view showing the SOI·MOS semiconductor device along a line I—I' in FIG. 4.

An insulating film 12 (e.g., a thermal oxide film or a CVD oxide film) having a thickness of about 1 μm is formed on a silicon substrate 11. In the insulating film 12, a recess portion 13a is formed immediately below a contact hole forming region, and a recess portion 13b is formed in a wiring layer forming region. Impurity-doped polysilicon films (conductors) 14a and 14b are buried in the recess portions 13a and 13b, respectively. Note that the polysilicon film 14b buried in the recess portion 13b constitutes a wiring layer. In addition, a monocrystalline silicon film 15 having a relatively small thickness of about 500 Å is formed on the insulating film 12 and the polysilicon films 14a and 14b. In the monocrystalline silicon film 15, for example, a MOSFET is formed. More specifically, n+-type impurity regions 16 serving as a source and a drain are formed in the monocrystalline silicon film 15 including the recess portions 13a and 13b. A gate oxide film 17 is formed in a channel region between the n+-type impurity regions 16. A gate electrode 18 is formed on the gate oxide film 17. Note that the gate electrode 18 can consist of impurity-doped polysilicon. A MOSFET comprises the n+-type impurity regions 16, the gate oxide film 17, and the gate electrode 18. In addition, an insulating interlayer 19 is formed on the entire surface of the resultant structure. A contact hole 20 is formed in the insulating interlayer 19 above the recess portion 13a. In this case, even when the contact hole 20 is formed to extend through the n+-type impurity region 16, since the recess portion 13a is formed, the contact hole 20 does not reach the insulating film 12. In addition, an Al wiring film 21 is formed in the contact hole 20 such that the n+-type impurity region 16 is brought into contact with the Al wiring film 21.

A method of manufacturing an SOI·MOS semiconductor device according to the present invention will be described below with reference to FIGS. 4 to 9. FIG. 7 is a sectional view showing the SOI·MOS semiconductor device along a line II—II' in FIG. 6, and FIG. 9 is a sectional view showing the SOI·MOS semiconductor device along a line III—III' in FIG. 8.

Figure 6:
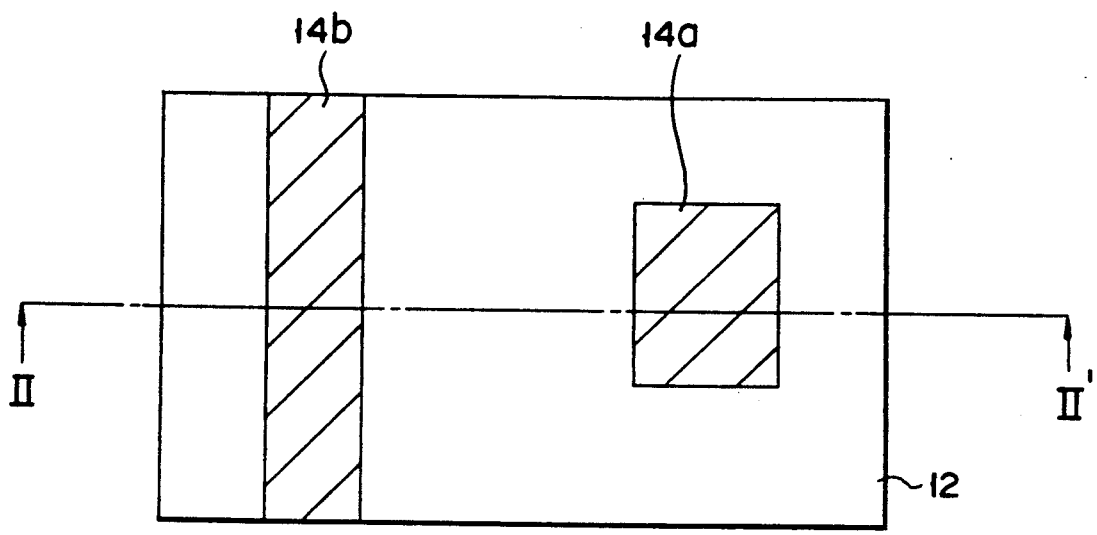
FIGS. 6 and 8 are plan views of patterns for explaining a method of manufacturing the SOI·MOS semiconductor device according to the embodiment of the present invention.
Figure 7:
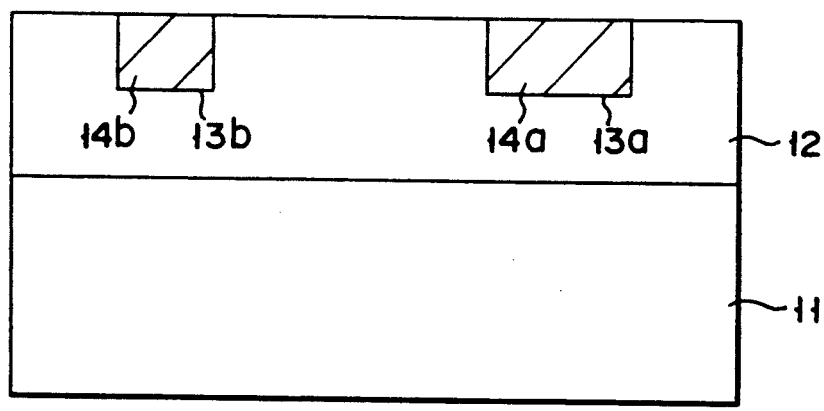
FIG. 7 is a sectional view showing the SOI·MOS device along a line II—II' in FIG. 6.

As shown in FIGS. 6 and 7, an insulating film 12 having a thickness of about 1 μm is formed by deposition on the silicon substrate 11. The insulating film 12 formed in a wiring layer forming region and immediately below a contact hole forming region is etched by a lithographic process to form the recess portions 13a and 13b each having a depth of about 0.5 μm. In addition, after a polysilicon film is formed on the entire surface of the resultant structure by deposition, an impurity is doped therein. The resultant structure is etched back to bury the impurity-doped polysilicon films 14a and 14b in the recess portions 13a and 13b, respectively.

Figure 8:
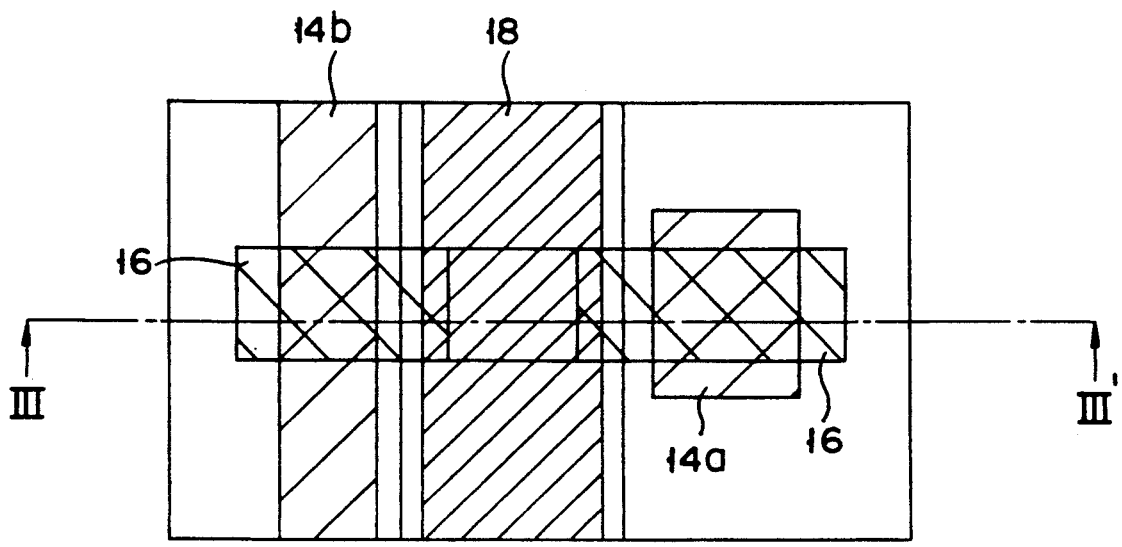
Figure 9:
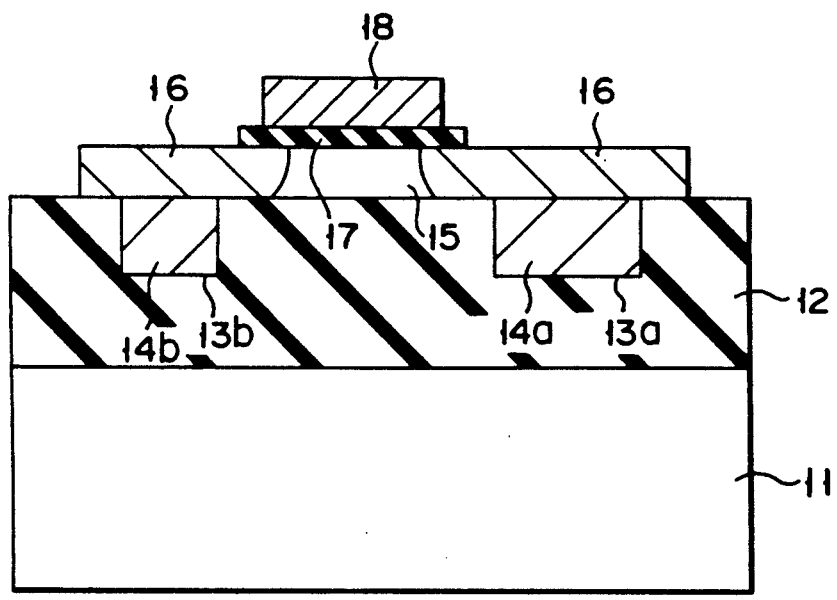
FIG. 9 is a sectional view showing the SOI·MOS device along a line III—III' in FIG. 8.

As shown in FIGS. 8 and 9, an amorphous silicon film is formed on the entire surface of the resultant structure by deposition to have a thickness of about 500 Å. Thereafter, the amorphous silicon film is crystallized by laser annealing, electron beam annealing, or the like to form the monocrystalline silicon film 15. The monocrystalline silicon film 15 is etched by a lithographic process to have an island shape, thereby forming an element active region. In addition, after the gate oxide film 17 is formed by a thermal oxidation method, a polysilicon film is formed on the entire surface of the resultant structure by deposition. In order to render the polysilicon film conductive, phosphorus (P) is diffused. Thereafter, the gate electrode 18 and a polysilicon wiring film (not shown) are formed by lithographic process. In addition, phosphorus or arsenic (As) ions are implanted in the resultant structure using the gate electrode 18 as a mask to form the n+-type impurity regions 16 serving as a source and a drain.

As shown in FIGS. 4 and 5, after the insulating interlayer 19 is formed on the entire surface of the resultant structure, the contact hole 20 is formed in the insulating interlayer 19 above the recess portion 13a by a lithographic process. The Al wiring film 21 is formed in a region including the contact hole 20 to connect the n+-type impurity region 16 with the Al wiring film 21.

With the above arrangement, a wiring layer (diffusion layer wiring) is not formed on the monocrystalline silicon film 15 which is formed to be thin but in the recess portion 13b formed in the insulating film 12. That is, the wiring layer consists of the polysilicon film 14b buried in the recess portion 13b of the insulating film 12. Therefore, the resistance of the wiring layer can be decreased, and a degree of freedom of design is increased to advantageously achieve high integration.

The recess portion 13a in which the polysilicon film 14a is buried is formed immediately below the contact hole 20 for connecting the Al wiring film 21 with the n+-type impurity regions 16. For this reason, even when the contact hole is formed by RIE or the like to extend through the n+-type impurity region 16 serving as a source or a drain, since the impurity-doped polysilicon (conductor) 14a is formed in the recess portion 13a, the contact hole does not reach the insulating film 12 therebelow. The area of the contact portion between the Al wiring film 21 and the n+-type impurity regions 16 is not decreased, and an increase in contact resistance between the Al wiring film 21 and the n+-type impurity regions 16 can be prevented.

Note that, in the above embodiment, although the n-channel SOI-MOS semiconductor device is described, the present invention can be applied to a p-channel or complementary MOS semiconductor device. In this above embodiment, although the polysilicon films 14a and 14b are formed by independently doping an impurity, the polysilicon films 14a and 14b and the n+-type impurity regions 16 may be simultaneously formed. In addition, the conductors buried in the recess portions 13a and 13b are not limited to polysilicon, and the conductors may consist of monocrystalline silicon, amorphous silicon, silicide, polycide, a refractory metal, or the like. In addition, the monocrystalline silicon film 15 can be replaced by an amorphous silicon film or a polysilicon film.

INDUSTRIAL APPLICABILITY

As described above, an SOI semiconductor device and a method of manufacturing the same of the present invention are useful in a case wherein a semiconductor device is manufactured without increasing a contact resistance and a wiring resistance of a diffusion layer even when the thickness of a monocrystalline silicon film formed on an insulating film is decreased.

I claim:
1. A silicon-on-insulator semiconductor device comprising:
   a semiconductor substrate;
   a first insulating film, having a recess portion, formed on said semiconductor substrate;
   a conductor formed in said recess portion;
   a semiconductor film formed on said first insulating film and said conductor;
   an impurity region formed in said semiconductor film and on said conductor;
   a second insulating film formed on said semiconductor film and said impurity region;
   a hole formed above said recess portion, said hole extending through the conductor, the impurity region and the second insulating film and being located away from said first insulating film; and
   a wiring film formed in said hole, said wiring film being connected to said conductor and said impurity region.

2. A silicon-on-insulator semiconductor device according to claim 1, wherein said conductor constitutes a wiring layer.

3. A silicon-on-insulator semiconductor device according to claim 1, wherein said conductor is polysilicon containing an impurity.

4. A silicon-on-insulator semiconductor device according to claim 1, wherein said semiconductor film has a thickness of not more than 500 Å.

5. A silicon-on-insulator semiconductor device according to claim 1, wherein said semiconductor film is a monocrystalline silicon film.

6. A silicon-on-insulator semiconductor device according to claim 1, wherein said impurity region is one of a source region and a drain region of a MOSFET.

* * * * *